Figure 1:
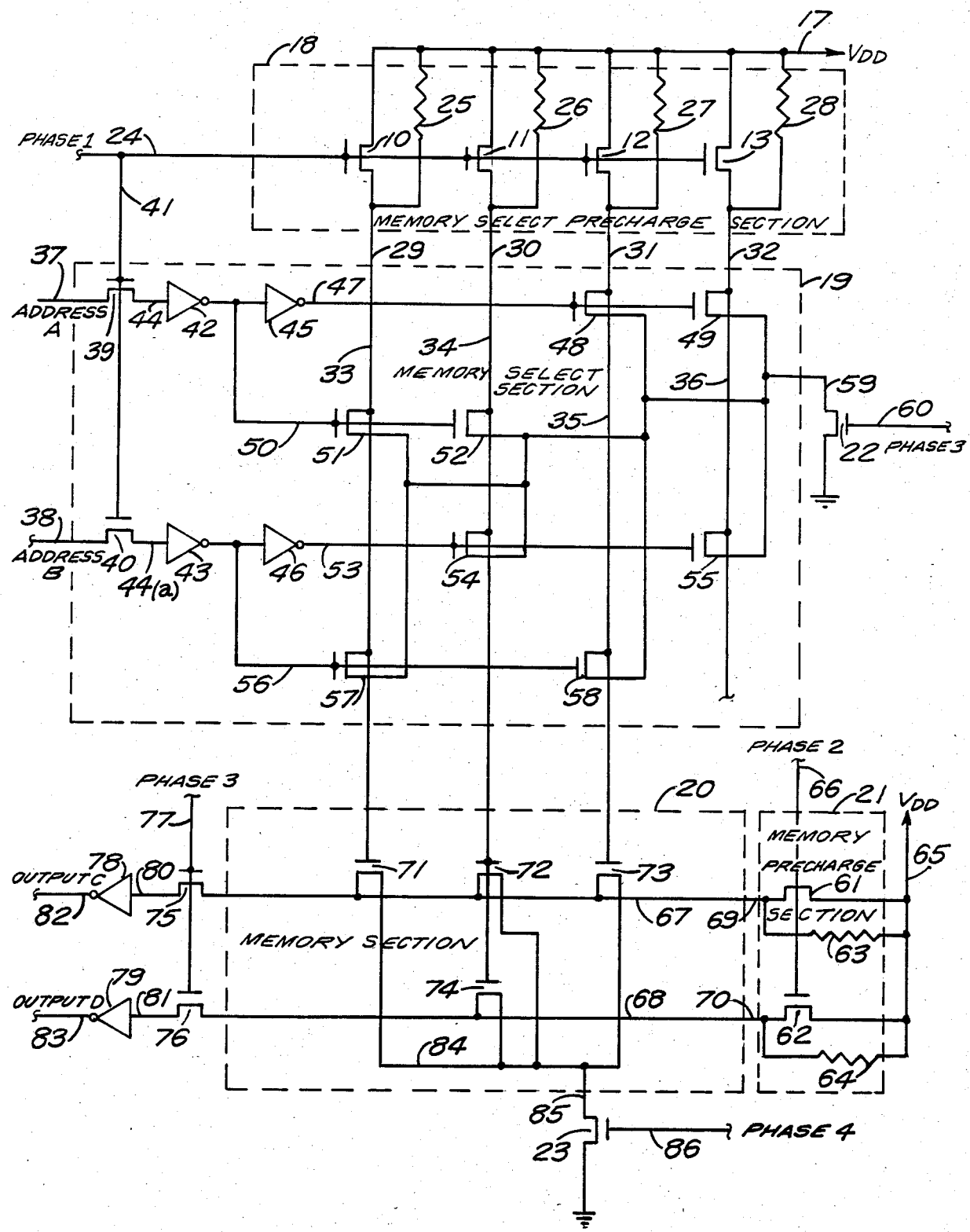

United States Patent [19]

Pechar, Jr. et al.

[11] Patent Number: 4,638,459
[45] Date of Patent: Jan. 20, 1987

[54] VIRTUAL GROUND READ ONLY MEMORY

[75] Inventors: Henry W. Pechar, Jr., Commack; James D. Sproch, Rocky Point, both of N.Y.

[73] Assignee: Standard Microsystems Corp., Hauppauge, N.Y.

[21] Appl. No.: 696,591

[22] Filed: Jan. 31, 1985

[51] Int. Cl.[4] ............................................. G11C 17/00
[52] U.S. Cl. ..................................... 365/104; 365/203
[58] Field of Search ........................ 365/203, 104, 94

[56] References Cited

U.S. PATENT DOCUMENTS

| 4,145,759 | 3/1979 | Remedi | 365/203 |
| 4,388,702 | 6/1983 | Sheppard | 365/104 |
| 4,485,460 | 11/1984 | Stambaugh | 365/203 |

Primary Examiner—Joseph A. Popek
Attorney, Agent, or Firm—Hopgood, Calimafde, Kalil, Blaustein & Judlowe

[57] ABSTRACT

A dynamic read only memory (ROM) which comprises a memory select precharge section, a memory select section, a memory section, a memory precharge section and a plurality of grounding devices. The ground reference for the pulldown transistors is selectively activated at an appropriate time such that the memory sections are active only for a relatively brief portion of the memory cycle, thereby reducing dc power consumption and simplifying the driver circuit.

10 Claims, 2 Drawing Figures

PHASE 1

PHASE 2

PHASE 3

PHASE 4

VIRTUAL GROUND READ ONLY MEMORY

The present invention relates generally to read only memories (ROMs), and more specifically to a dynamic, ratioless, virtual ground ROM.

Read only memories are an important part of modern electronic systems and in particular, they are an integral part of computers in which such memories store data continuously; even in the absence of power. Typically, data are retrieved from a ROM only during the read cycle of the system. One class of ROMs—the wired program ROM—is programmed during fabrication by either omitting or adding elements (such as transistors) or by making connections to preselected elements of the memory. Once programmed, the data stored in a read only memory cannot be altered.

In the design of read only memories it is common practice to use dynamic circuit techniques to reduce power consumption and layout area. Thus, in the conventional dynamic ROM the nodes are precharged to a high voltage and then other circuitry in the memory selectively activates pulldown transistors to achieve the desired logic output pattern. Although the use of this arrangement does reduce power consumption further refinement is highly desirable. Specifically, the circuitry required for dynamic operation in known systems is relatively complex.

It is accordingly an object of the present invention to provide an improved dynamic ROM, which has low power consumption.

It is another object of the invention to provide an improved ROM of the type described, which has simplified drive circuitry.

A further object of the present invention is to provide an improved ROM of the type described herein which has a short access time.

To these ends, the present invention provides a dynamic ROM which comprises an arrangement of transistors for storing and accessing data in binary form. The transistors forming the storage and decoding sections of the ROM are only activated during a small portion of the read cycle by selectively activating the ground reference for the pulldown transistors at the appropriate time. By way of example, the dynamic ROM of the instant invention is described as operating under a four phase clocking scheme in which the first phase precharges decoder lines; the second phase precharges output lines; the third phase virtually grounds the decoder section; and the fourth phase virtually grounds the output section.

Figure 2:
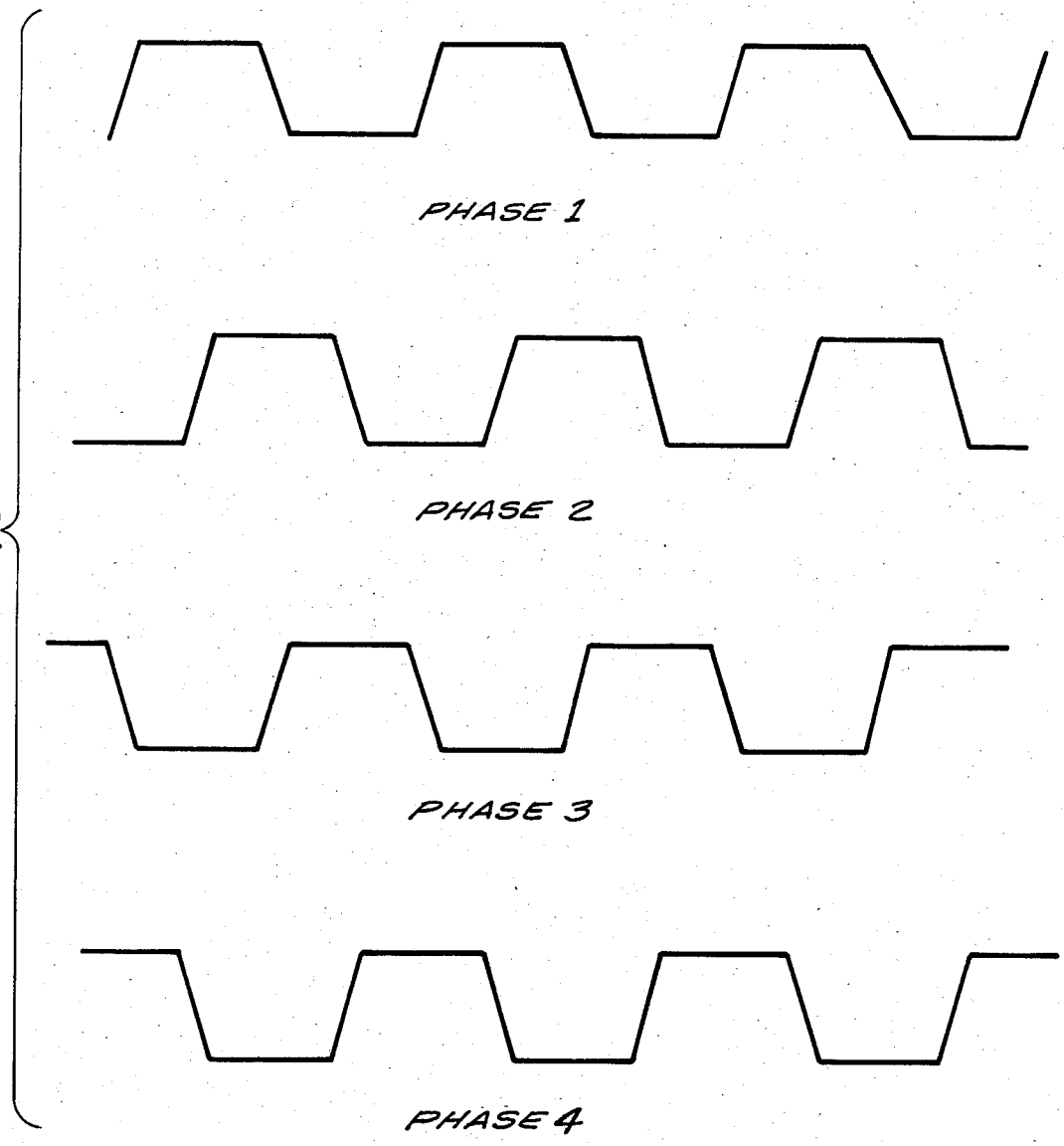

To the accomplishment of the above and such further objects as may hereinafter appear, the present invention relates to a virtual ground read only memory substantially as defined in the appended claims and as described in the following specification as considered with the following drawings, in which:

FIG. 1 is a schematic diagram of a ROM cell arrangement in accordance with an embodiment of the present invention; and FIG. 2 is a timing diagram of the four-phase clock phase signals applied to the ROM illustrated schematically in FIG. 1.

The ROM according to the present invention as illustrated in FIG. 1 comprises a memory select precharge section 18; a memory select section 19; a memory section 20; a memory precharge section 21; a memory select virtual grounding transistor 22; and a memory virtual grounding transistor 23. In a preferred construction of the instant invention, all of the transistors discussed herein are field-effect transistors.

The memory select precharge section consists of four transistors 10–13 which have their drain terminals connected to a source of positive voltage $V_{DD}$ 17; the gate terminals of transistors 10–13 are all connected to the phase 1 clock input line 24 (see FIG. 2). The source terminals of transistors 10–13 are connected to $V_{DD}$ 17 by resistors 25–28, respectively. The source terminals of transistors 10–13 are connected to memory select precharge nodes 29–32, which are formed by combining the capacitance of the source terminals and memory select lines 33–36.

The memory select section 19 receives an address A signal at input line 37 and an address B at input line 38. Lines 37 and 38 are connected to the drain terminals of transistors 39 and 40. The gate terminals of transistors 39 and 40 are connected together by a line 41 which is, in turn, connected to the phase 1 clock input line 24. The source terminals of transistors 39 and 40 are connected to inverters 42 and 43, as shown. These connections form capacitive address storage nodes 44 and 44(a). The outputs of inverters 42 and 43 are connected to the inputs of inverters 45 and 46.

The output of inverter 45 is connected via line 47 to the interconnected gate terminals of transistors 48 and 49. The output of inverter 42 is connected via line 50 to the interconnected gate terminals of transistors 51 and 52. The output of inverter 46 is connected via line 53 to the interconnected gate terminals of transistors 54 and 55. The output of inverter 43 is connected via line 56 to the interconnected gate terminals of transistors 57 and 58.

The drain terminals of transistors 51 and 57 are both connected to memory select line 33, those of transistors 52 and 54 to memory select line 34, those of transistors 48 and 58 to memory select line 35, and those of transistors 49 and 55 to memory select line 36. The source terminals of transistors 48, 49, 51, 52, 54, 55, 57 and 58 are all connected to virtual ground node 59. The gate of transistor 22 is connected by a line 60 which is the phase 3 clock input. The drain of transistor 22 is connected to virtual ground node 59, and the source of transistor 22 is connected to ground.

The memory precharge section 21 comprises transistors 61 and 62 and resistors 63 and 64. The drain terminals of transistors 61 and 62 are both connected to $V_{DD}$ supply source 65, as are resistors 63 and 64. The other terminals of resistors 63 and 64 are connected to the source terminals of transistors 61 and 62, respectively, and the gate terminals of transistors 61 and 62 are interconnected to the phase 2 input line 66. The source terminals of transistors 61 and 62 are also connected to internal memory output lines 67 and 68, respectively. Lines 67 and 68, with the source terminals of transistors 61 and 62, form capacitive storage nodes 69 and 70. The drain terminals of transistors 71, 72, and 73 are all connected to line 67.

The drain terminal of transistor 74 is connected to line 68, it being noted that lines 67 and 68 are also connected to the drain terminals of transistors 75 and 76, respectively. The gate terminals of transistors 75 and 76 are interconnected to the phase 3 input line 77, while the source terminals of transistors 75 and 76 are connected to the inputs of inverters 78 and 79. The source terminals of transistors 75 and 76 and the inputs to inverters 78 and 79 and their interconnecting lines form output storage nodes 80 and 81. The outputs of inverters 78 and 79 are connected to the C data output 82, and to the D data output 83, respectively. The source terminals of transistors 71–74 are all connected to line 84, which is, in turn, connected to virtual ground node 85 formed by that line and the drain of transistor 23. The gate of transistor 23 is connected to the phase 4 input line 86.

In known ROMs, various nodes are precharged to a high voltage, and then other circuitry selectively activate pull down transistors to achieve the desired output. In contrast, in a ROM according to the present invention, logical output is achieved by virtually grounding the various memory select lines, as more fully discussed hereinbelow. It is noted that a reference potential other than ground may be appropriate in various applications of the instant invention.

The ROM described herein is referred to as a virtual ground ROM as sections 19 and 20 are selectively grounded during clock phases 3 and 4 by active means through transistors 22 and 23, respectively, rather than being permanently connected to ground as in the prior art ROM circuits.

In the following description of the operation of the ROM of FIG. 1, the four-phase scheme shown in FIG. 2 is employed for purposes of clarity. The operation of the memory cycle can best be understood as occurring in four stages, each stage corresponding to a period in which one of the four-phase clocks (1–4) shown in FIG. 2 is active, that is, at a logic "one" level. It should be noted that the various clock phases are active during only a portion of the read cycle and that each clock phase follows the preceding phase of the read cycle by 90°.

During the first stage of a read operation, the precharge phase, the phase 1 clock is at a logic "one" and is applied through line 24 to the interconnected gates of transistors 10–13. These transistors are placed into a conductive state and precharge nodes 29–32 are charged to a voltage substantially equal to $V_{DD}$. At low clock frequencies, optional resistors 25–28 supply an additional path through which precharge nodes 29–32 are charged. An active phase 1 clock also turns on transistors 39 and 40 via line 41 connected to their respective gate terminals. The address data, which is either a logic "one" or "zero", on lines 37 and 38 is applied through transistors 39 and 40 to inverters 42 and 43, and from the outputs of these inverters to transistors 51, 52, and 57, 58, respectively. The outputs of inverters 42 and 43 are applied to the inputs of inverters 45 and 46 which are, in turn, applied to transistors 48, 49 and 54, 55, respectively. When clock phase 1 goes to logic "zero" this address data is latched at storage nodes 44 and 44a as transistors 39 and 40 turn "off" and are in a high impedance state. Similarly, transistors 10–13 turn "off" and the precharge nodes 29–32, remain charged.

During the second stage of the memory read cycle, and 90° after the phase 1 clock has gone to a logic "one", the phase 2 clock goes to a logic "one". The phase 2 clock is applied to line 66, which is connected to the gate terminals of transistors 61 and 62, which with optional resistors 63 and 64, comprise memory precharge section 21. Transistors 61 and 62 are thus placed in a conductive state and storage nodes 69 and 70 charge to a voltage level substantially equal to the supply voltage $V_{DD}$. When the phase 2 clock goes to a logic "zero", transistors 61 and 62 turn off, therefore consuming substantially no power and both nodes 69 and 70 remain charged.

During the third stage of the memory read cycle and 90° after the phase 2 clock has gone to logic "one", the phase 3 clock goes to a logic "one"; this occurs around the time the phase 1 clock has gone to logic "zero". The phase 3 clock is applied via line 60 to the gate of transistor 22 which renders transistor 22 conductive thereby connecting virtual ground node 59 to ground. The phase 3 clock is also applied to line 77, which is connected to transistors 75 and 76 to turn on these transistors and begin the transfer of information from nodes 69 and 70 to storage nodes 80 and 81.

During the fourth stage of the memory read cycle and 90° after the phase 3 clock has gone to logic "one", the phase 4 clock goes to logic "one". The phase 4 clock is applied to the gate of transistor 23, which thereupon turns on, discharging virtual ground node 85 and activating those transistors 71–74 of memory section 20 which have a logic "one" applied to their respective gates. Data is valid during the phase 4 clock and is latched into nodes 80 and 81 by the falling edge of the phase 3 clock. This data is buffered and inverted by inverters 78 and 79 and is available on output lines 82 and 83.

The content of the ROM is determined at the fabrication state by selectively forming transistors at the desired locations of the memory section 20. In the embodiment shown in FIG. 1 the diffusion (mesa) layer is used to control the formation of transistors. A programmed location is designated by the presence of a transistor. Alternatively, the gate connection or a transistor may be added or omitted to designate a storage location. The presence of a transistor at the intersection of memory select lines 33–36 and the internal output lines 67 and 68 results in a "zero" on the internal output lines 67 and 68 which is read as a "one" on the output lines 82 and 83. Each decode select line 33–36 is only activated when all those memory select transistors, 48, 49, 51, 52, 54, 55, 57 and 58 on that line, are in the "off" state. Consequently, the state of the address input lines 37 and 38 determine which of the decode select lines 33–36 will be active and, therefore, which of the memory transistors 71–74 will be switched on. In other words, the electrical state of the memory select lines determine the output of the memory.

For example, if the input address line 37 is a logic "zero" and the input address on line 38 is a logic "one", only decode select line 35 will have both transistors 48 and 58 connected thereto, in the "off" state. Consequently, line 35 will be at a logic "one". When the phase 4 clock is at a logic "one" transistor 73 will be "on". This will result in node 69 being discharged to the virtual ground and the logic state of line 67 will be changed to logic level "zero". Transistor 74 is off because line 34 has been previously grounded by transistor 22. Thus, line 68 remains at the precharge potential giving a logic "one". The logic levels on line 67 and 68 will be inverted by inverters 78 and 79 to give a data output of logic "one" on output line 82 and a logic "zero" on output line 83, respectively. The output data for any of the four possible address combinations can be similarly found.

The ROM of the present invention as described hereinabove thus provides highly desirable characteristics that were not attainable in prior art ROMs. The power consumption of the ROM is considerably reduced by the virtual ground technique as only a few of the transistors comprising the memory are active at any one time over the four phases of the memory cycle. At other times, the inactive transistors consume no power. This configuration has the important advantage over the prior art of offering a more compact and economical circuit layout.

It will be appreciated that various changes and modifications may be made within the spirit and scope of the invention. For example, other clocking means may be used, and semiconductor transistors other than those mentioned hereinabove may be substituted for some or all of said transistors. Further, the embodiment shown in FIG. 1 shows a two-bit memory, but any number of bits may be stored by increasing the number of storage locations of the ROM.

What is claimed:

1. A read only memory comprising:
   (a) a memory select section including input means and a plurality of memory select lines;
   (b) virtual grounding means connected to a reference node for switched coupling said reference node in response to a first lock signal to a reference potential;
   (c) switching means connected to said memory select lines for selectively coupling said memory select lines to said reference node in respose to a second clock signal applied to said input means, said virtual grounding means providing said reference node with said reference potential in one switching state thereof; and
   (d) a memory section connected to said memory select section, said memory section being responsive to the electrical state of said memory select lines so as to produce an output determined thereby.

2. The read only memory according to claim 1, wherein said virtual grounding means comprises a field effect transistor connected to clocking means of a digital system and said reference potential is a ground potential, said transistor electrically coupling said reference node to said ground potential in response to a clock signal supplied by said clocking means.

3. In a digital system including means for generating a plurality of clock signals, a read only memory adapted to output predetermined information during a read cycle, said memory comprising:
   (a) memory select precharge means for capacitively charging a plurality of memory select nodes defined thereby in response to a first clock phase signal of said read cycle;
   (b) memory precharge means for capacitively charging a plurality of memory nodes defined thereby in response to a second clock phase signal of said read cycle;
   (c) a memory select section comprising input means and a plurality of memory select lines, said memory select lines being connected to said memory select nodes;
   (d) switching means for selectively coupling said memory select lines to a reference node in response to an address input applied to said input means of said memory select section;
   (e) virtual grounding means for actively coupling said reference node to a reference potential in response to a third clock phase signal of said read cycle; and
   (f) a memory section connected to said memory select section comprising output means and a plurality of memory lines, said memory lines being connected to said memory nodes and responsive to the electrical state of said memory select lines so as to produce at said output means an output determined thereby.

4. The read only memory according to claim 3, further comprising second virtual grounding means for selectively coupling said memory lines to said reference potential in response to a fourth clock phase signal of said read cycle.

5. The read only memory according to claim 4, wherein said switching means comprises at least one field effect transistor.

6. The read only memory according to claim 5, wherein said switching means and said virtual grounding means comprise at least one field effect transistor.

7. The read only memory according to claim 4, wherein said first clock phase signal is active during only a portion of said read cycle.

8. The read only memory according to claim 7, wherein said second clock phase signal is active during only a portion of said read cycle.

9. The read only memory according to claim 8, wherein said third clock phase signal is active during only a portion of said read cycle.

10. The read only memory according to Claim 9, wherein said fourth clock phase signal is active during only a portion of said read cycle.

* * * * *